United States Patent [19]
Namiki et al.

[11] Patent Number: 5,457,565
[45] Date of Patent: Oct. 10, 1995

[54] ORGANIC ELECTROLUMINESCENT DEVICE

[75] Inventors: Tohru Namiki; Hitoshi Sato; Kenichi Nagayama; Teruichi Watanabe, all of Tsurugashima, Japan

[73] Assignee: Pioneer Electronic Corporation, Tokyo, Japan

[21] Appl. No.: 153,924

[22] Filed: Nov. 18, 1993

[30] Foreign Application Priority Data

Nov. 19, 1992 [JP] Japan .................................. 4-310452

[51] Int. Cl.$^6$ ...................................................... G02F 1/153
[52] U.S. Cl. .............................. 359/273; 257/40; 257/103
[58] Field of Search ...................................... 359/265, 271, 359/273, 275; 257/40, 103

[56] References Cited

U.S. PATENT DOCUMENTS 5,247,190  9/1993  Friend et al. .............................. 257/40

*Primary Examiner*—John D. Lee
*Attorney, Agent, or Firm*—Foley & Lardner

[57] ABSTRACT

An organic electroluminescent device comprises an anode, a positive-hole transport layer made of an organic compound, an emitting layer made of an organic compound, and a cathode which are layered in sequence, further comprising an electron-injecting layer containing at least one of alkaline earth metal oxides and disposed between the emitting layer and the cathode. This device emits light at a high luminance and a high efficiency upon application of a low voltage together with reduction of the decrement of luminance in the running of emitting light of the device. Selection scope for cathode materials is expanded because of the device is free from the restriction of a low work function for the cathode layer. The cathode can be made a transparent electrode such as ITO. Anode and cathode lines may be formed with low resistance material. As a result, emitting efficiency and life time of the device is improved.

12 Claims, 5 Drawing Sheets

EMISSION

EMISSION

EMISSION

EMISSION

EMISSION

EMISSION

ORGANIC ELECTROLUMINESCENT DEVICE

BACKGROUND OF THE INVENTION

1. Field of the invention

The present invention relates to an electroluminescent device (hereinafter referred as "EL device") having an emitting layer made of an emitting substance, which utilizes an electroluminescence phenomenon that is the emission of light resulting from application of an electric field or electrons to the substance. More particularly, it is concerned with an organic EL device in which the emitting layer is made of an organic luminous substance.

2. Description of the prior art

As organic EL devices, there have been known a device of two-layer structure type having two layers made of organic compounds respectively as shown in FIG. 1, in which an organic fluorescent thin film 3 (hereinafter referred as "emitting layer") and an organic positive-hole transport layer 4 are laminated with each other and are arranged between a metal cathode 1 and a transparent anode 2. There have been also known a device of three-layer structure type having three layers made of organic compounds respectively as shown in FIG. 2, in which an organic electron transport layer 5, an emitting layer 3 and an organic hole transport layer 4 are laminated in sequence and are sandwiched as a whole between a metal cathode 1 and a transparent anode 2. (Japanese Patent Application non-examined publication Tokkai hei 2-216790)

The hole transport layer 4 facilitates the infusion of the holes from the anode and blocks electrons. The electron transport layer 5 facilitates the infusion of electrons from the cathode. In these organic EL devices, a glass substrate 6 is furnished outside the transparent anode 2. The recombination of electrons injected from the metal cathode 1 and the holes injected from the transparent anode 2 to the emitting layer 3 generates excitons. The excitons emit light when they are deactivated through radiation. This light radiates toward the outside through the transparent anode 2 and the glass substrate 6. The transparent anode 2 is formed of an electric conductive material with a high work function such as indium-tin oxide (hereinafter referred as "ITO").

The cathode 1 is formed of a metal with a lower work function such as aluminum (Al), magnesium (Mg), indium (In), silver (Ag) or alloys of the individual metals thereof Al-Mg, Ag-Mg, for example. Generally, the cathode 1 has the following desired functions. First, it efficiently injects electrons to the emitting layer, and second it is used as bus lines for electric current in an organic EL device in the form of matrix structure. It is necessary for the required first and second functions to select restrictively a cathode material having both a low work function and a low resistance so as to be formed as a thin film.

However, most conventional cathode metal materials have insufficient injecting efficiency of electrons. The EL device using such a cathode material has a decrement of luminance during running of the emitting process.

SUMMARY OF THE INVENTION

An object of the present invention is therefore to provide an organic EL device capable of stably and continuously emitting light at a high luminance and a high efficiency.

An organic EL device according to the present invention comprises an anode, a positive-hole transport layer made of an organic compound, an emitting layer made of an organic compound and a cathode which are layered in sequence, further comprising an electron-injecting layer containing at least one of alkaline earth metal oxides and disposed between said emitting layer and said cathode.

According to the present invention, there is obtained an organic EL device capable of stably emitting light at a high luminance.

DETAILED DESCRIPTION OF PREFERRED EMBODIMENTS

The embodiments according to the present invention will be described in more detail with reference to the accompanying drawings.

Figure 1:
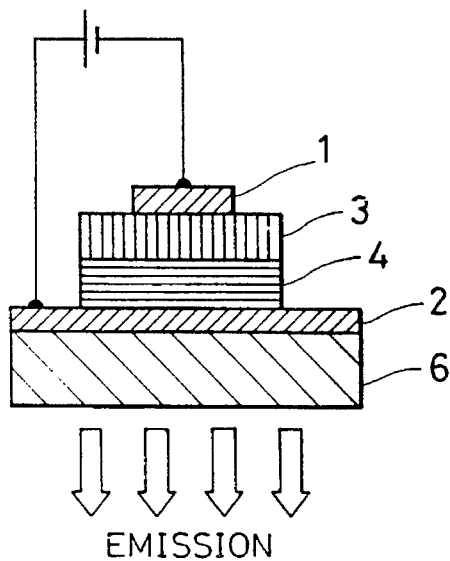
FIG. 1 is a schematic diagram showing an organic EL device with two-layer structure.
Figure 2:
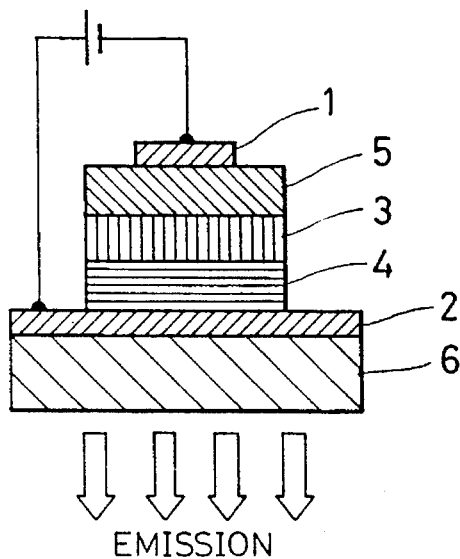
FIG. 2 is a schematic diagram showing an organic EL device with three-layer structure.
Figure 3:
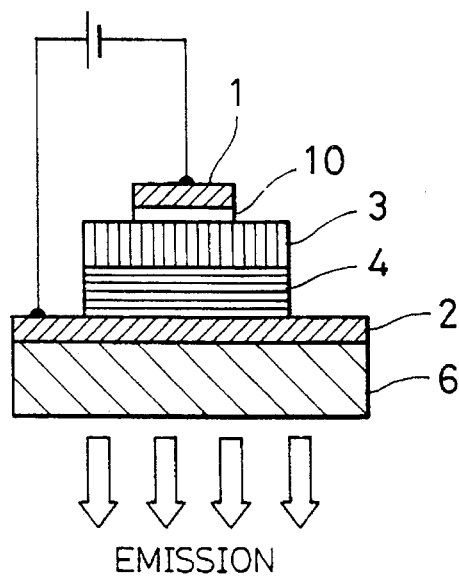
FIG. 3 is a schematic diagram showing an organic EL device of an embodiment according to the present invention with two-layer structure.
Figure 4:
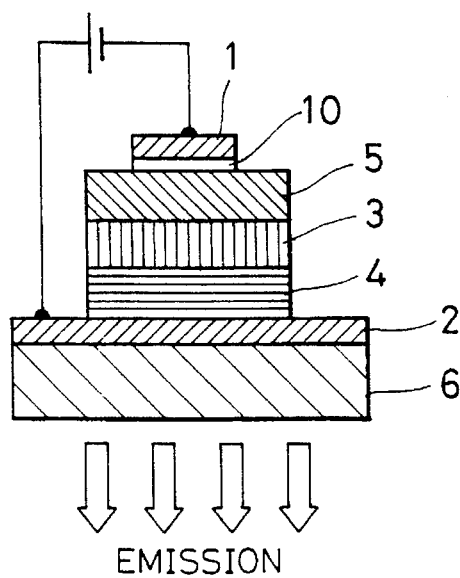
FIG. 4 is a schematic diagram showing an organic EL device of an embodiment according to the present invention with three-layer structure.

The EL device in accordance with the present invention has the two-layer structure formed by layering an anode 2, a positive-hole transport layer 4 of organic compound, an emitting layer 3 of organic compound, an electron injecting layer 10 and a cathode 1 in sequence on a glass substrate 6 (FIG. 3). Alternatively, another EL device in accordance with the present invention has the three-layer structure formed by layering an anode 2, an organic positive-hole transport layer 4, an organic emitting layer 3, an organic electron transport layer 5, an electron injecting layer 10 and a cathode 1 in sequence on a glass substrate 6 (FIG. 4).

The electron-injecting layer 10 comprises at least one of oxides of alkaline earth metal (Beryllium (Be), Magnesium (Mg), Calcium (Ca), Strontium (Sr), Barium (Ba), Radium (Ra)), for example, SrO, CaO, BaO, (Sr,Ca,Ba)O. The electron-injecting layer 10 is transparent and has a low work function of about 1.2 eV. Although the electron-injecting layer functions as an insulator, the device using this layer emits light at a high luminance only by optimize the thickness of the injecting layer. Therefore, the order of the function layers 3, 4, 5 on the substrate is various. In other words, since the electron-injecting layer 10 is used only for the first function the first and the second functions of the cathode, its interposition expands the selectional variety of materials for the electrode layers.

The emitting layer 3 may be made of a material with a high quantum yield having a capability of emitting light as well as transporting electrons, for example, a quinoline derivative such as tris(8-quinolinol)aluminum (hereinafter referred as "$Alq_3$").

Further, the emitting layer 3 may be made of an organic host substance having a capability of transporting a carrier, i.e., at least one of electron and positive-hole, and an organic guest substance having a capability of emitting light in response to the recombination of electron and positive-hole. This is called a guest-host type emitting layer. Examples of the host substances are $Alq_3$, coumarinic derivatives, etc. Examples of the guest substances are dicyanomethylene pyran derivatives, quinacridone derivatives, etc. A substance having the absolute value oxidation and reduction potential respectively large in the cyclic voltammetry (CV) is used for the host substance of the emitting layer 3. A substance having the absolute value oxidation and reduction potential respectively small in the CV is used for the guest substance of the emitting layer 3. The more the overlapped portion of the spectral distributions of both the wavelengths stimulated from the guest substance and fluorescent wavelengths of the host substance, the higher the emitting efficiency becomes in the EL device. The guest substance is preferably selected from fluorescent dyes with a high quantum yield. The guest substance is contained at a concentration 0.01 wt.% through 10 wt.% 1 in the fluorescent emitting layer comprising the host material, because the emission with a high luminance of the EL device can be obtained at a low applied voltage.

Next, it is preferable that the hole transport layer is made of N,N'-diphenyl-N-N'-bis(3-methylphenyl)-1,1'-biphenyl-4,4'-diamine (hereinafter referred as "TPD"). Further, the compounds known as CTM (carrier transporting materials) are suitably used alone or as a mixture for the hole transport layer. The hole transport layer may be divided into individual first and second hole transport layers.

Furthermore, the three-layer EL device further comprising the electron transport layer 5 as shown FIG. 4, has also the same advantageous effect as the two-layer type EL device above mentioned. In the case that the three-layer structure is utilized for the EL device, the electron transport layer 5 of the organic EL device is preferably made of the material having a large capability of transporting electrons such as the foregoing $Alq_3$ or 2-(4'-tert-butylphenyl)-5-(biphenyl)-1,3,4-oxadiazole (so called "t-Bu-PBD").

For example, as shown in FIG. 3, an ITO anode 2, a TPD positive-hole transport layer 4, an $Alq_3$ emitting layer 3, a (Sr,Ca,Ba)O electron-injecting layer 10 and an Al cathode 1 may be layered in sequence on a glass substrate 6 so that an organic EL device is manufactured. At least one of the electrodes 1 and 2 may be transparent. Alternatively both electrodes may be made of transparent conductive materials. The thickness of the electrodes may be about 100 through 5000 angstroms.

Figure 5:
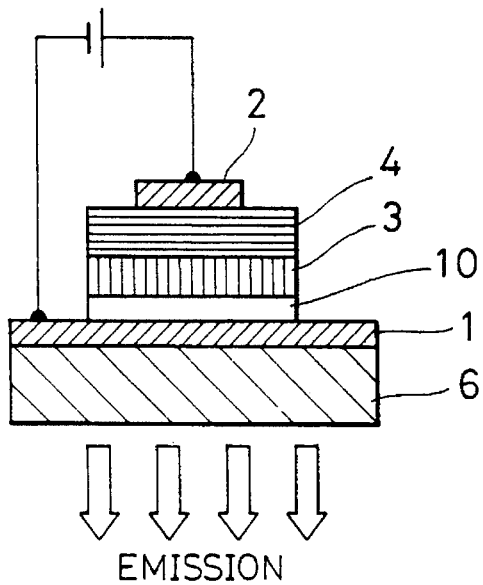
FIG. 5 is a schematic diagram showing another organic EL device of an embodiment according to the present invention with two-layer structure.

An organic EL device may be manufactured as shown in FIG. 5, in such a manner that an ITO cathode 1, an electron-injecting layer 10, an $Alq_3$ emitting layer 3, a TPD positive-hole transport layer 4 and a Platinum (Pt) anode 2 are layered in sequence on a glass substrate 6, since the electron-injecting layer 10 has a high electron-injecting efficiency. In this way, although ITO with a high work function is conventionally used for the anode, such ITO may be used for the cathode due to the interposition of the electron-injecting layer. Even if a transparent conductive materials such as ITO, $SnO_2$ has a relatively high work function, it can be used for the cathode layer. The cathode may be made of materials with much higher work function than that of conventional EL devices.

In addition, an organic EL device may be manufactured as shown FIG. 3, in such a manner that a $SnO_2$ anode 2, a TPD positive-hole transport layer 4, an $Alq_3$ emitting layer 3, a CaO electron-injecting layer 10 and a $SnO_2$ cathode 1 are layered in sequence on a glass substrate 6. In this way, a transparent conductive material with the same work function or the same material may be used for both the anode 2 and cathode 1. ITO material is also used for both the electrodes in the organic EL device.

Figure 6:
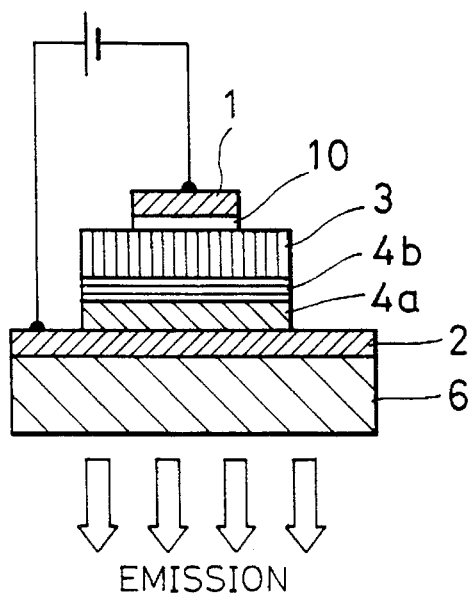
FIG. 6 is a schematic diagram showing another organic EL device of an embodiment according to the present invention.

Inventors manufactured concretely organic EL devices each having the structure as shown in FIG. 6 under conditions of the deposition rates and the corresponding thin-film making methods as shown in Table 1 in which the obtained EL device had first and second positive-hole transport layers 4a and 4b, an emitting layer 3, an electron-injecting layer 10 and a cathode 1 which are layered in sequence on a glass substrate 6 with striped ITO anodes 2.

The first positive-hole transport layer 4a made of 4,4',4"-tris[N-(3-methylphenyl)-N-phenylamino]triphenylamine (hereinafter referred as "MTDATA") was with thickness 300 angstroms. The second positive-hole transport layer 4b made of TPD was with thickness 300 angstroms. The emitting layer made of $Alq_3$ was with thickness 550 angstroms. Each electron-injecting layer made of SrO was with 1 angstroms, 5 angstroms or 10 angstroms. The cathode made of Al was with thickness 500 angstroms.

In addition, a comparative EL device was manufactured under the same conditions as the embodiments excepting the electron-injecting layer of SrO was excluded from between the emitting layer and the cathode, i.e., the electron-injecting layer at thickness 0 angstroms.

MTDATA is represented by the following formula;

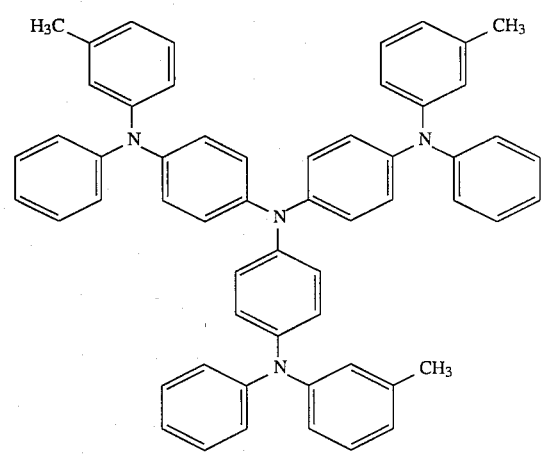

MTDATA of the first positive-hole transport layer has a high melting point and a high glass transition point and then is hardly crystallized and further has an excellent thin-film formation property. Since MTDATA has a high conductivity, the first positive-hole transport layer prevents undesired heat influence to TPD the second positive-hole transport layer upon the application of electric currents.

TABLE 1

| Function layer | Deposition rate (angstroms/sec.) | Thin-film making method |
| --- | --- | --- |
| MTDATA | 2–4 | Resistance heating deposition |
| TPD | 2–4 | Resistance heating deposition |
| Alq$_3$ | 2–4 | Resistance heating deposition |
| SrO | 1–2 | Electron beam deposition |
| Al | 7–14 | Resistance heating deposition |

Figure 7:
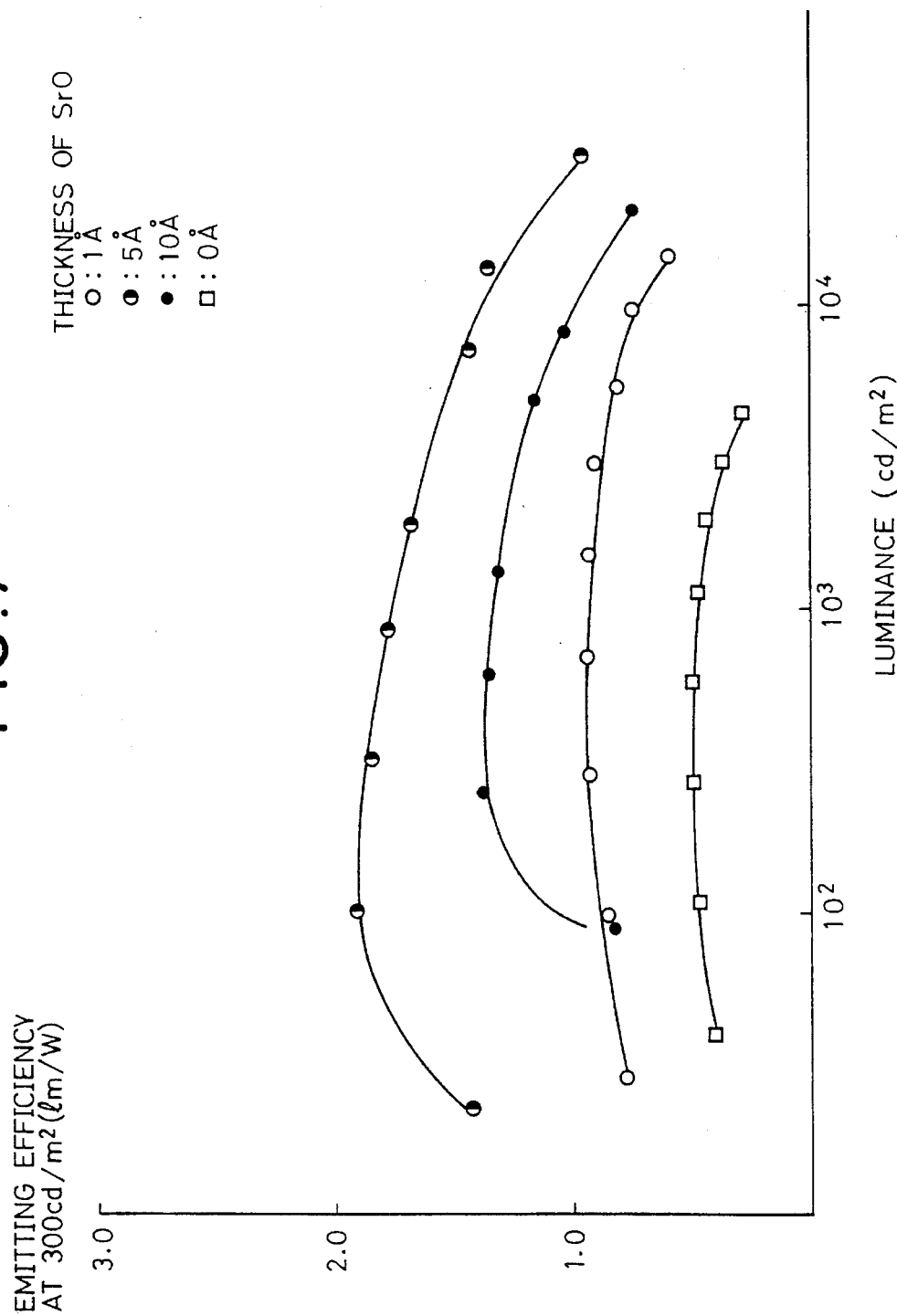
FIG. 7 is a graph showing changes of emitting efficiencies with respect to luminance of the EL devices of embodiments.

FIG. 7 shows changes of emitting efficiencies of the embodiment and the comparative EL devices with respective to luminance. Table 2 shows luminance-emitting efficiency properties thereof at luminance 300 cd/m$^2$.

TABLE 2

| Thirckness of SrO (angstroms) | Emitting efficiency at 300 cd/m2 (1 m/W) |
| --- | --- |
| 0 | 0.49 |
| 1 | 0.94 |
| 5 | 1.9 |
| 10 | 1.4 |

Figure 8:
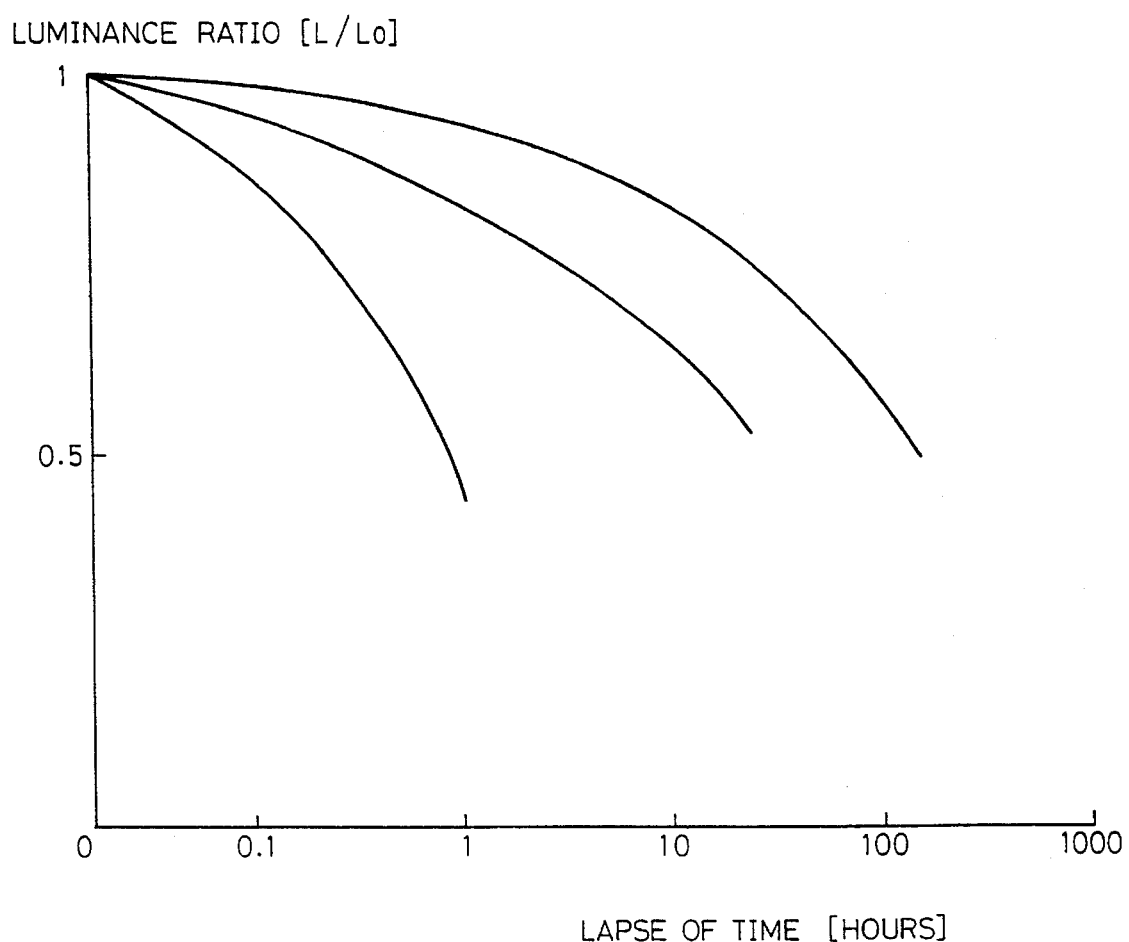
FIG. 8 is a graph showing characteristics of luminance decrement embodiment of the organic EL devices.

FIG. 8 shows luminance decrement properties resulting from the running of emitting tests of the above EL devices. Graph in FIG. 8 shows luminance ratio [lapse luminance (L)/initial luminance (L0)] at the ordinate and the lapse of time [hours] at the abscissa.

As seen from the result, embodiments with the interposition of SrO electron-injecting layers at range 1–10 angstroms were improved in the emitting property and life time in comparison with the comparative EL device excluding SrO electron-injecting layer. Particularly, SrO electron-injecting layer of 5 angstroms was excellent. The embodiment of electron-injecting layer having the thickness range of 1–10 angstroms is preferable because high emitting efficiency more than about 1.0 (1 m/W) at luminance 300 cd/m$^2$ is obtained.

As described above, the organic EL device according to the present invention comprises an anode, a positive-hole transport layer made of an organic compound, an emitting layer made of an organic compound and cathode which are layered in sequence, further comprising an electron-injecting layer containing at least one of alkaline earth metal oxides and disposed between said emitting layer and said cathode. Therefore, it is possible according to the present invention to improve the durability of the organic EL device which emits light at a high luminance and a high efficiency upon application of a low voltage together with the following advantageous effects (a)–(d):

(a) Emitting property of the device is improved. In the running of emitting light of the device, the decrement of luminance is reduced.

(b) Selection scope for cathode materials is expanded because of free from the restriction of low work function for the cathode layer.

(c) The cathode can be made a transparent electrode such as ITO. In this case, emitted light radiates through the transparent cathode and the anode is not restricted by a transparent material selection. Therefore, the anode may be made of a material with a very high work function, i.e., Au (work function S=5.1 eV): Pt (S=5.65 eV): Se (S=5.9 eV): Ni (S=5.15 eV): Pd (S=5.12 eV): or metal alloy thereof which are higher than that of ITO (work function S=5.0 eV) in view of positive-hole injecting efficiency. Furthermore, thickness and transparency of the anode is not restricted and therefore, a low resistance value metal anode lines may be formed. As a result, emitting efficiency and life time of the device is improved.

(d) When the cathode and anode are formed of transparent material such as ITO or SnO$_2$, emitted light radiates through both electrodes, so that a both side display is obtained.

What is claimed is:

1. An organic EL device comprising:

an anode, a positive-hole transport layer made of an organic compound, an emitting layer made of an organic compound, and a cathode which are layered in sequence; and an electron-injecting layer containing at least one of alkaline earth metal oxides and disposed between said emitting layer and said cathode.

2. An organic EL device according to claim 1, wherein said cathode is made of a transparent conductive material.

3. An organic EL device according to claim 1, wherein said cathode and said anode are made of transparent conductive materials.

4. An organic EL device according to claim 1, further comprising an electron transport layer interposed between said electron-injecting layer and said emitting layer.

5. An electroluminescent (EL) device, comprising:

an anode;

a positive-hole transport layer, comprised of an organic compound, disposed adjacent to a surface of the anode;

a cathode;

an electron-injecting layer, including an alkaline earth metal oxide, disposed adjacent to a first surface of the cathode; and an emitting layer, comprised of an organic compound, disposed between the positive-hole transport layer and the electron-injecting layer.

6. An EL device as recited in claim 5, further comprising a glass substrate, wherein a second surface of the cathode, opposite the first surface of the cathode, is formed adjacent to the glass substrate.

7. An EL device as recited in claim 5, wherein the alkaline earth metal oxide is selected from the group consisting of SrO, CaO and BaO.

8. An EL device as recited in claim 5, wherein a work function of the cathode is approximately equal to a work function of the anode.

9. An EL device as recited in claim 8, wherein the cathode and the anode are comprised of a same material.

10. An EL device as recited in claim 8, wherein the cathode and the anode are comprised of indium-tin oxide.

11. An EL device as recited in claim 5, wherein the cathode is comprised of indium-tin oxide.

12. An EL device as recited in claim 5, further comprising an electron transport layer interposed between the electron-injecting layer and the emitting layer.

* * * * *